US009958489B2

(12) United States Patent
Stichowski et al.

(10) Patent No.: US 9,958,489 B2
(45) Date of Patent: May 1, 2018

(54) METHOD AND APPARATUS FOR TESTING A CONTROL PILOT LINE

(71) Applicant: VOLKSWAGEN AG, Wolfsburg (DE)

(72) Inventors: Torsten Stichowski, Magdeburg (DE); Benny Bruhnke, Lehre (DE)

(73) Assignee: VOLKSWAGEN AG, Wolfsburg (DE)

( * ) Notice: Subject to any disclaimer, the term of this patent is extended or adjusted under 35 U.S.C. 154(b) by 211 days.

(21) Appl. No.: 14/220,692

(22) Filed: Mar. 20, 2014

(65) Prior Publication Data

US 2014/0285209 A1    Sep. 25, 2014

(30) Foreign Application Priority Data

Mar. 22, 2013   (DE) .................. 10 2013 005 072

(51) Int. Cl.
| | |
|---|---|
| *G01R 31/00* | (2006.01) |
| *B60L 3/00* | (2006.01) |
| *B60L 3/04* | (2006.01) |
| *B60L 11/18* | (2006.01) |
| *G01R 31/02* | (2006.01) |

(52) U.S. Cl.
CPC .......... *G01R 31/006* (2013.01); *B60L 3/0069* (2013.01); *B60L 3/04* (2013.01); *B60L 11/1818* (2013.01); *B60L 11/1846* (2013.01); *G01R 31/026* (2013.01); *B60L 2250/16* (2013.01); *B60L 2250/22* (2013.01); *B60L 2270/32* (2013.01); *B60L 2270/34* (2013.01); *Y02T 10/7005* (2013.01); *Y02T 10/7072* (2013.01); *Y02T 90/121* (2013.01); *Y02T 90/128* (2013.01); *Y02T 90/14* (2013.01); *Y02T 90/163* (2013.01); *Y02T 90/169* (2013.01); *Y04S 30/14* (2013.01)

(58) Field of Classification Search
CPC .. G01R 31/006; G01R 31/025; G01R 31/021; G01R 31/026; G01R 31/04; G01R 31/041; G01R 31/045; G01R 1/0416
USPC ............... 324/503, 500, 510, 511; 320/109
See application file for complete search history.

(56) References Cited

U.S. PATENT DOCUMENTS

| | | | | |
|---|---|---|---|---|
| 4,005,313 A | * | 1/1977 | Tibbits ..................... | B60D 1/62 280/422 |
| 5,997,320 A | * | 12/1999 | DeMello ................... | B60D 1/64 439/148 |
| 7,688,024 B2 | * | 3/2010 | Kamaga ................ | B60L 3/0069 180/65.21 |

(Continued)

FOREIGN PATENT DOCUMENTS

| | | |
|---|---|---|
| DE | 102010030732 A1 | 1/2012 |
| DE | 102012015911 B3 | 10/2013 |

(Continued)

OTHER PUBLICATIONS

Search Report for German Patent Application No. 10 2013 005 072.3; Dec. 18, 2013.

*Primary Examiner* — Giovanni Astacio-Oquendo
(74) *Attorney, Agent, or Firm* — Barnes & Thornburg LLP

(57) ABSTRACT

A method for checking a control pilot, referred to below as CP, line of a charging socket of an electrically drivable transportation means. The method includes closing the charging socket, as a result of which an electrical, in particular galvanic, connection is closed between the CP line and a line of the charging socket providing electrical energy, and checking a signal received via the CP line in response to the closing. Also disclosed is a corresponding apparatus.

9 Claims, 3 Drawing Sheets

(56) References Cited

U.S. PATENT DOCUMENTS

| | | | | |
|---|---|---|---|---|
| 9,590,342 B1* | 3/2017 | Shaeffer | | H01R 31/06 |
| 2005/0037632 A1* | 2/2005 | Ihde | | B60D 1/62 |
| | | | | 439/35 |
| 2005/0236935 A1* | 10/2005 | Ohmori | | H01H 57/00 |
| | | | | 310/328 |
| 2010/0213896 A1* | 8/2010 | Ishii | | B60L 3/0069 |
| | | | | 320/109 |
| 2011/0000677 A1* | 1/2011 | Overfield | | E21B 33/0385 |
| | | | | 166/336 |
| 2011/0127956 A1* | 6/2011 | Mitsutani | | B60K 6/365 |
| | | | | 320/109 |
| 2011/0202192 A1* | 8/2011 | Kempton | | B60L 11/1824 |
| | | | | 700/291 |
| 2011/0233129 A1* | 9/2011 | Horvath | | B01D 29/21 |
| | | | | 210/243 |
| 2011/0273139 A1* | 11/2011 | Hofheinz | | B60L 3/0023 |
| | | | | 320/109 |
| 2012/0091958 A1* | 4/2012 | Ichikawa | | B60L 3/0046 |
| | | | | 320/109 |
| 2012/0098490 A1* | 4/2012 | Masuda | | B60L 3/0069 |
| | | | | 320/109 |
| 2012/0206092 A1* | 8/2012 | Yukizane | | B60L 11/1811 |
| | | | | 320/107 |
| 2013/0013128 A1* | 1/2013 | Geldmacher | | B60R 25/24 |
| | | | | 701/2 |
| 2013/0013230 A1* | 1/2013 | Kalokitis | | G01C 7/04 |
| | | | | 702/57 |
| 2013/0300429 A1 | 11/2013 | Jefferies et al. | | |
| 2014/0184157 A1* | 7/2014 | Liu | | B60L 11/1809 |
| | | | | 320/109 |
| 2014/0232355 A1* | 8/2014 | Masuda | | B60L 3/0069 |
| | | | | 320/137 |
| 2015/0104961 A1* | 4/2015 | Bito | | B60L 11/1818 |
| | | | | 439/142 |

FOREIGN PATENT DOCUMENTS

| | | | | |
|---|---|---|---|---|
| DE | 102012020409 A1 * | 4/2014 | | H01R 13/5213 |
| EP | 2218607 A1 | 8/2010 | | |
| WO | 2010011545 A1 | 1/2010 | | |
| WO | 2011031801 A2 | 3/2011 | | |

* cited by examiner

US 9,958,489 B2

METHOD AND APPARATUS FOR TESTING A CONTROL PILOT LINE

PRIORITY CLAIM

This patent application claims priority to German Patent Application No. 10 2013 005 072.3, filed 22 Mar. 2013, the disclosure of which is incorporated herein by reference in its entirety.

SUMMARY

Illustrative embodiments relate to an apparatus and a method for checking a control pilot (CP) line of a charging socket of an electrically drivable transportation means. In particular, illustrative embodiments relate to a possibility for regularly checking the proper functioning of the CP line within the transportation means.

BRIEF DESCRIPTION OF THE DRAWINGS

Exemplary embodiments will be described in detail below with reference to the attached drawings, in which.

DETAILED DESCRIPTION OF THE DISCLOSED EMBODIMENTS

Figure 1:
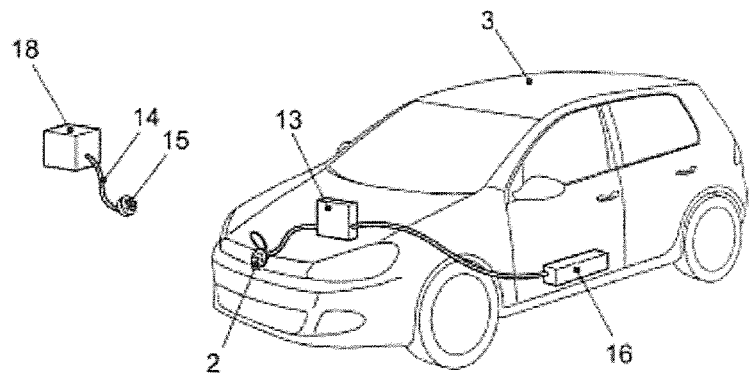
FIG. 1 shows a schematic view of components of a charging operation of an electrically drivable transportation means.

FIG. 1 shows a basic sketch of a charging operation of an electrically drivable vehicle 3. A rechargeable battery as electrochemical energy store 16 is arranged within the vehicle 3. This rechargeable battery can be used to drive the electrically drivable vehicle 3. The electrochemical energy store 16 is connected to a charging socket 2 in the front of the vehicle 3 via a charger 13. A charging plug 15 can supply electrical energy from a charging station 18 to the vehicle 3 via a charging cable 14 via the charging socket 2.

Figure 2:
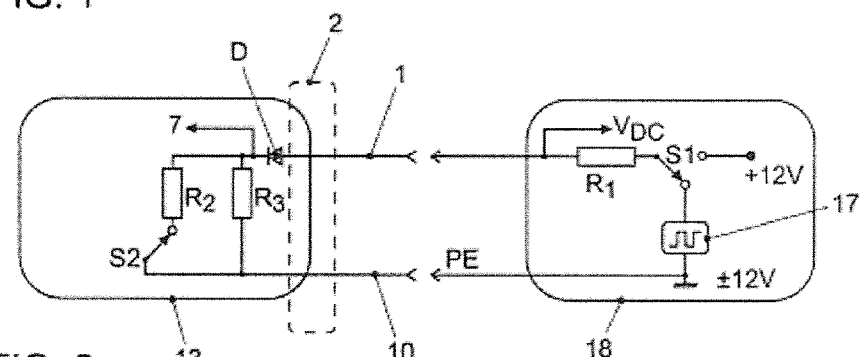
FIG. 2 shows a schematic, very simplified illustration of components of an arrangement for charging operation monitoring.

FIG. 2 shows a schematic, very simplified illustration of two communication lines between a charging station 18 and a vehicle interface, or charger, 13. A function generator 17 within the charging station 18 can be connected to a CP line 1 via a switch S1 and an ohmic resistor R1, which CP line extends between the charging station 18 and the vehicle interface 13. A diode D is connected to electrical ground 10 via a resistor R3 within the vehicle interface 13. Optionally, a further ohmic resistor R2 can be connected in parallel with the resistor R3 via a second switch S2. Tapping-off in the direction of an evaluation unit 7 (not illustrated in FIG. 2) takes place between the diode D and the resistors R2, R3. The evaluation unit 7 is in this case designed to perform a frequency and/or pulse width measurement. In other words, during a charging operation, when the contact is intact, a signal from the function generator 17 can be detected and evaluated by the evaluation unit 7. A switch S1 also enables an optional connection of the first resistor R1 to a permanent DC voltage if the signal from the function generator 17 is no longer required.

Figure 3:
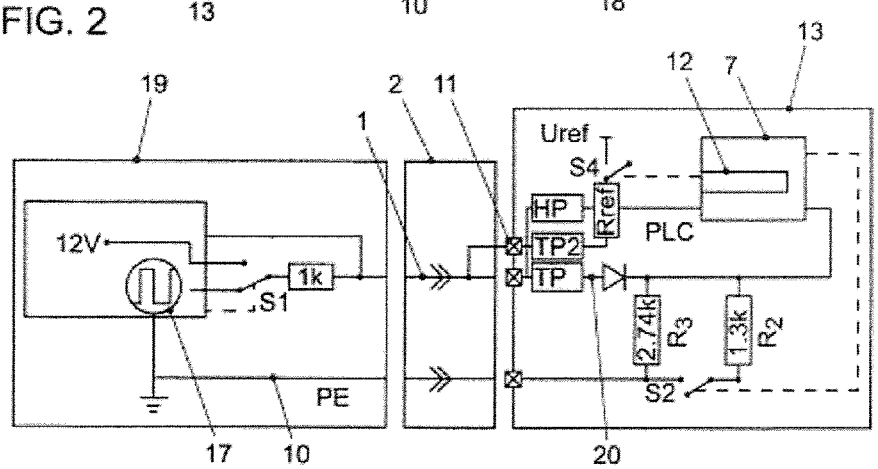
FIG. 3 shows a schematic, very simplified illustration of components of an alternative arrangement for charging operation monitoring.

FIG. 3 shows an alternative arrangement from the prior art, wherein an in-cable control box 19 in the charging cable provides the function generator 17. The in-cable control box 19 is connected to the charger 13 of an electrically drivable transportation means 3 via a charging socket 2, in which an additional pin 11 is provided and is connected to the CP line 1. The additional pin 11 is in this case connected switchably to a reference voltage Uref and an additional logic 12 within an evaluation unit 7 via a low-pass filter TP2 and an ohmic reference resistor Rref of a wakeup line 20. An electrical signal can be applied to the CP line 1 within the charging socket 2 via the additional pin 11, and this electrical signal can be evaluated by the evaluation unit 7. The arrangement shown in FIG. 3 is therefore also suitable for implementing a function check on the CP line 1 within the vehicle independently of a charging operation, in other words when the charging socket 2 is closed. The additional hardware complexity involved for the additional wakeup line 20, which in reality is several meters long, within the vehicle, the additional logic for switching the switch S4 and the additional pin 11 within the charging socket 2 is, however, a significant disadvantage of the suggested solution.

Disclosed embodiments provide a method for checking a control pilot (CP) line to a charging socket of an electrically drivable transportation means. The CP line is provided as a control/communication line between a charging infrastructure and the transportation means. That section of the CP line which can be checked by means of the disclosed method begins within the charging socket and can lead as far as into a charger within the transportation means. The charging socket is used for connecting an external power supply for the transportation means. The transportation means can be, for example, a passenger vehicle, a truck, a watercraft, or an aircraft. The method comprises closing of the charging socket, as a result of which an electrical, in particular galvanic, connection between the CP line and a line providing electrical energy of the charging socket is closed. Closing of the charging socket is understood to mean initiation of a state in which the charging socket is in particular not in contact with or cannot be brought into contact with a charging infrastructure device. This is therefore the case, for example, when the transportation means is being operated/moved. Closing of the charging socket can moreover effect a fluid-tight termination to keep moisture and dirt away from the electrical contacts. By closing of the charging socket, a reversible electrical connection between the CP line and the line providing electrical energy is produced. In this case, this line is not necessarily designed to conduct electrical energy for the propulsion of the transportation means, but in particular should be understood to be a signal line. For example, the line providing electrical energy can be a plug present (PP) line for checking the presence of a termination element (plug), which in any case is provided in many systems for energy transmission between the charging infrastructure and the transportation means. Often, the PP line in this case provides a DC voltage ("permanent plus"). In this way, in response to the closing, an electrical signal which can be received via the CP line can be checked. If the line providing electrical energy transmits a DC voltage signal, the electrical signal can substantially correspond to this DC voltage signal. If the electrical connection has an ohmic resistance, the received signal can have a correspondingly reduced DC voltage. In this way, a diagnostics possibility is provided without a further pin and without an additional line between the charging socket and the charger of the vehicle, by means of which diagnostics possibility the CP line of the vehicle can be checked without any electrically connected charging infrastructure.

The closing of the electrical connection can be performed by an electrical conductor in a closure element for the charging socket. The closure element can be configured as, for example, a dummy plug, for example consisting of rubber. An electrical connection is provided within the dummy plug and connects the connections of the charging socket for the CP line and the line providing electrical energy. In this case, after termination of the charging operation, the dummy plug can be inserted as closure element into the charging socket by the user of the vehicle and then, depending on the logic stored in the charger, permanent or iterative checking of the proper functioning of the CP line is performed.

Alternatively or in addition, the closing of the electrical connection can be performed by a switch, in particular a microswitch, which responds to a state of a closure element for the charging socket. In other words, the electrical connection does not need to be provided within the closure element, but should merely be provided in response to the closing of the charging socket. In this case, the closure element can be configured as a flap, for example, which actuates a switch/microswitch depending on its position. If the flap is closed, the microswitch closes the electrical connection between the CP line and the line providing electrical energy. It goes without saying that a fully passive closure element in the form of a dummy plug can also actuate a corresponding switch purely mechanically, without any electrical connection, in response to which the switch produces the electrical connection. This provides the further advantage that even proper closing of the charging socket after termination of the charging operation can be diagnosed and signaled to a user of the transportation means in the event of a fault. For this purpose, the received signal can be checked in terms of a predefined threshold value or in terms of a specific signal form and in this way the presence of the electrical connection between the CP line and the line providing electrical energy can be identified.

In accordance with a second disclosed embodiment, an apparatus for checking a control pilot (CP) line of a charging socket of an electrically drivable transportation means is proposed. In this case, the apparatus comprises at least part of a CP line, a line providing electrical energy which ends in the charging socket and an evaluation unit. The evaluation unit is designed to check a signal from the line providing electrical energy which is received via the CP line when the charging socket is closed. The features of the apparatus and the advantages of these features clearly correspond to those relating to the method, for which reason reference is made to the first mentioned embodiment in this regard so as to avoid repetition.

Optionally, the apparatus can comprise a closure element for the charging socket, which closure element is designed to electrically, in particular galvanically, connect the CP line and the line providing electrical energy to one another in a state in which the closure element closes the charging socket. This can be performed, for example, by an electrical conductor. Optionally, a passive or active element for energy processing can be provided, which element modifies the signal from the line providing electrical energy. For example, in response to the electrical energy from the line providing electrical energy, a function generator could also be induced to transmit predefined signals via the CP line. For reasons of cost, however, a simple conductor, a passive resistor, a capacitor or similar simple components are more suitable. In this way, a predefined change to the electrical signal can be brought about and can be distinguished from an accidental short circuit between the contacts of the CP line and the line providing electrical energy.

Further, the closure element itself may comprise an electrical conductor and/or a switch, in particular a microswitch, which responds to a state of the closure element. For example, the above-mentioned elements can be cast ("molded") into the closure element, which protects them particularly well from mechanical loading.

Further, the evaluation unit of the apparatus may be designed to output signaling to a user of the electrically drivable vehicle when the received signal falls below or exceeds a predefined threshold value. The signaling can be performed, for example, by means of a display in the instrument cluster or via a tone generator. This can be performed, depending on a seat occupancy sensor, to the effect that when the user is present within the passenger compartment, an optical or acoustic signaling is performed within the passenger compartment, whereas for the case where the user is not within the passenger compartment, a predefined signal is output via the direction indicators and/or the vehicle horn to inform the user in a suitable manner. It is of course possible for a plurality of measurements for verifying a negative check on the CP line to be used before signaling is output to the user.

Optionally, the line providing electrical energy can be a plug present (PP) line, in accordance with the present disclosure. This provides the advantage that an additional line and introduction to the relevant standards can be dispensed with.

Further, the closure element used may be designed to produce a plug-type connection or be configured pivotably. In addition, locking mechanisms in the form of a snap-action/latching connection or a bayonet closure can be provided to fix the closure element in the charging socket.

In accordance with a third disclosed embodiment, a vehicle comprising an apparatus in accordance with the second-disclosed embodiment is proposed. With reference to the features of this aspect, reference is again made to the statements made in conjunction with the first-mentioned and second-mentioned embodiments so as to avoid repetition.

Figure 4:
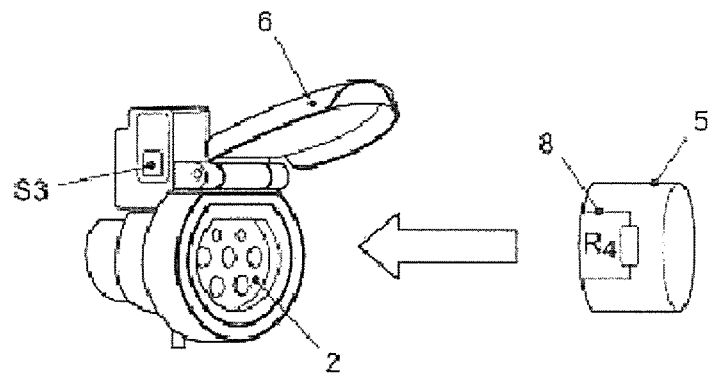
FIG. 4 shows a perspective illustration of a charging socket and a closure element in accordance with at least one exemplary embodiment.

FIG. 4 shows a charging socket 2, which can be closed by means of a charging flap 6 as closure element. A microswitch S3 is arranged in the region of a hinge of the pivotable charging flap 6, via which microswitch the status of the charging flap 6 can be identified. The microswitch S3 produces an electrical connection between a CP line and a line providing energy when the charging flap 6 closes the charging socket 2. To not impair external diagnostics or use of the CP line when contact is made with the charging socket 2 by a plug of a charging station 18, the electrical connection is isolated by means of the microswitch S3 as soon as the charging flap 6 is opened. In addition or as an alternative to the charging flap 6, a dummy plug 5 can be used as closure element to produce an electrical connection 8 via an ohmic resistor R4 between the CP line and the line providing electrical energy.

Figure 5:
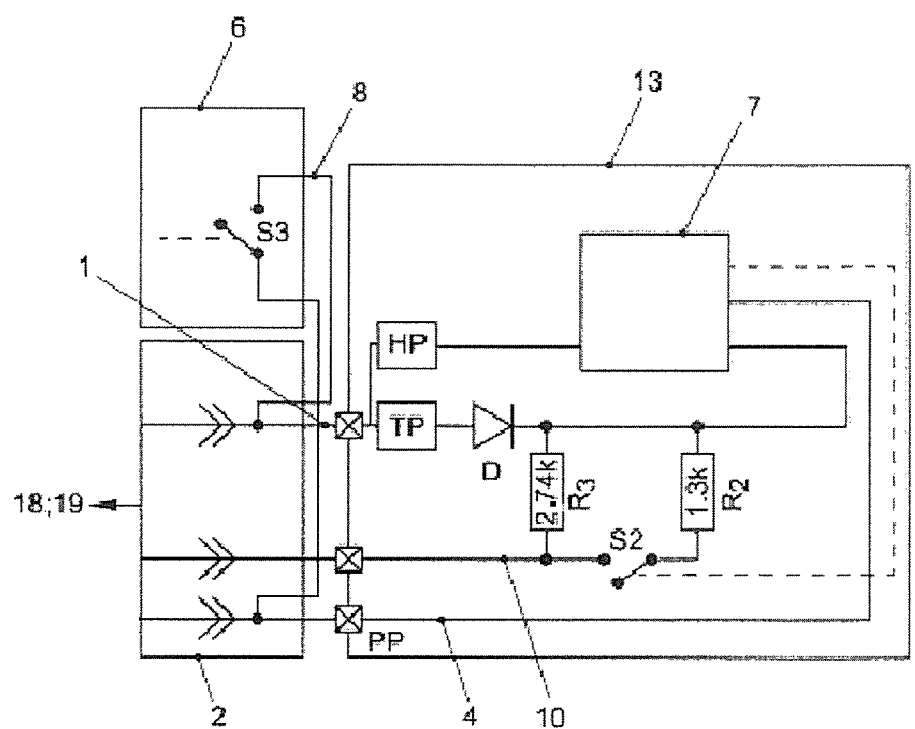
FIG. 5 shows a schematic overview of components of a charging socket and a charger in accordance with at least one exemplary embodiment.

FIG. 5 shows a schematic illustration of components of a charging socket 2 with a charging flap 6 and a charger 13. A switch S3 in the region of the charging flap 6 is designed to produce an electrical connection 8 between a CP line 1 and a PP line 4. An evaluation unit 7 arranged within the charger 13 receives a signal, filtered by a high-pass filter HP, from the CP line 1 for evaluating, for example, externally provided signals from a function generator 17. In addition, a low-pass filter TP with a series-connected diode D for inputting a DC voltage signal from the CP line 1 into the evaluation unit 7 is provided. As a further input, the PP line 4 is connected to the evaluation unit 7. If the switch S3 is now open, the evaluation unit 7 receives exclusively a signal received via the CP line 1, which signal is provided from the outside to the charging socket 2. This can be, for example, a pulse-width-modulated signal of a function generator 17 within a charging station 18. If the charging station 18 is not properly connected to the charging socket 2 or does not output a signal, the evaluation unit 7 of the charger 13 does not receive any external input variable via the CP line 1. If the charging flap 6 is closed, this state can be identified by the evaluation unit 7 by virtue of the electrical connection 8 closed via the switch S3 connecting the CP line 1 to the electrical potential of the PP line 4. If now, during travel (for example when the D ("drive") stage is engaged) no PP potential is measured at the CP line 1, the user of the vehicle can be instructed to check that the charging flap 6 is positioned correctly. If the user confirms the correct position, for example, the evaluation unit 7 can output signaling which informs the user of the fact that the CP line 1 obviously has a defect.

Figure 6:
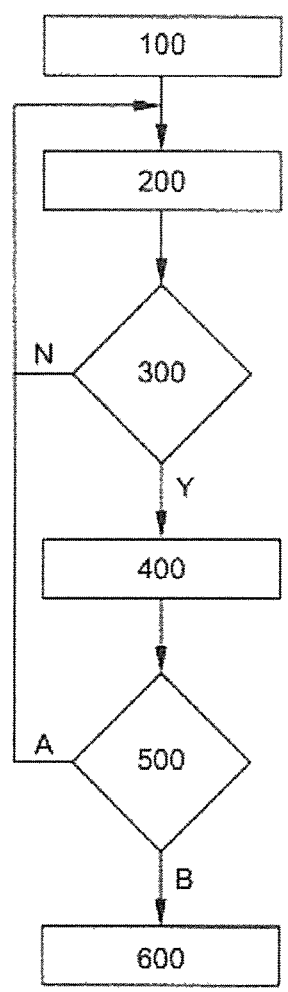
FIG. 6 shows a flow chart visualizing steps in accordance with at least one exemplary embodiment of the disclosed method.

FIG. 6 shows a flowchart visualizing steps in accordance with an exemplary embodiment of the disclosed method. In step 100, a charging socket 2 of an electrically drivable transportation means 3 is closed. This produces an electrical, in particular galvanic, connection between the CP line 1 and a line 4 providing electrical energy of the charging socket 2. In response to the closing of the charging socket 2, a check is performed in step 200 to ascertain whether a predefined signal is received via the CP line 1. For this purpose, in step 300, a decision is made as to whether a threshold value is being exceeded or undershot. If the threshold value is not undershot ("N"), the method continues with step 200. In other words, a loop for checking the received signal is run through again. If however, the threshold value is being undershot ("Y"), in step 400 there is an output of signaling to the user of the vehicle 3 which instructs the user to check whether the charging socket 2 is correctly closed. In step 500, there are two options: either the user closes the charging socket (A), in response to which the method is continued with step 200, or the user confirms ("B") that the charging socket is correctly closed. In the latter case, in step 600, signaling is performed to the user to the effect that the CP line 1 is defective.

A core concept of the present disclosure consists in performing the check of a control pilot line of an electrically drivable transportation means in a manner which is as inexpensive and efficient as possible. In this case, a check on that section of the control pilot line which is located exclusively within the transportation means even during a charging operation has been intentionally dispensed with. According to the disclosed embodiments, no additional line is required within the vehicle or no additional pin is required within the charging socket. Nevertheless, the requirement for regular automatic checking of the control pilot line within the vehicle is satisfied.

Even when the aspects and advantageous embodiments have been described in detail with reference to the exemplary embodiments explained in conjunction with the attached figures of the drawing, modifications and combinations of features of the illustrated exemplary embodiments are possible for a person skilled in the art without departing from the scope of the present disclosure for which the scope of protection is defined by the attached claims.

The electrification of individual people transportation is advancing with great strides. To safeguard charging operations of electrically drivable transportation means, so-called control pilot (CP) lines are used to ensure proper contact is made between the charging infrastructure and the transportation means. In this case, control devices of the infrastructure communicate with control devices of the electrical energy processing means within the transportation means via the CP line and in the process exchange information items, for example relating to characteristics of the electrical energy to be exchanged. In addition, proper electrical contact-making during the charging operation can be ensured via the CP line by virtue of test signals being generated on one side and confirmed on the other side.

EP 2 218 607 A1 and EP 2 515 411 A1 relate to such monitoring systems for charging operations of electrically drivable transportation means.

DE 10 2010 030 732 A1 relates to an apparatus for controlling the electrical charging operation of an energy store of a vehicle, wherein the connection of a battery to the electrical grid of the vehicle is controlled via a charging flap, which closes a connection for electrical energy of a transportation means.

The arrangements disclosed in the prior art do not, however, enable localization of a potential fault on a CP line. However, a fault can arise, for example, within the charging infrastructure, within the charging cable or within the transportation means to be charged. In the meantime, endeavors are being made by authorities (in particular in the USA) to set standards in respect of regular checking of those sections of the CP line which are arranged within the transportation means as well.

The invention claimed is:

1. A method for checking a control pilot (CP) line of a charging socket of an electrically drivable vehicle, the method comprising:
    closing the charging socket, as a result of which a galvanic connection is closed between the CP line and a line of the charging socket which provides a signal to the CP line; and
    checking the signal received via the CP line in response to the closing using an evaluation unit,
    wherein closing the charging socket prevents contact with charging infrastructure.

2. The method of claim 1, wherein the closing of the charging socket is performed by an electrical conductor in a closure element for the charging socket and/or a microswitch, which responds to a state of the closure element for the charging socket.

3. The method of claim 2, wherein the closure element is designed to produce a plug-type connection or is configured pivotably.

4. The method of claim 1, further comprising signaling to a user of the electrically drivable vehicle when the received signal falls below or exceeds a predefined threshold value.

5. An apparatus for checking a control pilot (CP) line of a charging socket of an electrically drivable vehicle, the apparatus comprising:
    at least part of a CP line;
    a line which provides electrical energy and ends in the charging socket; and
    an evaluation unit, wherein the evaluation unit is designed to check a signal of the line which provides electrical energy which is received via the CP line in the evaluation unit when the charging socket is closed, wherein when the charging socket is closed it is prevented from contacting charging infrastructure, and wherein the line which provides electrical energy is a plug present (PP) signal line.

6. The apparatus of claim 5, further comprising a closure element for the charging socket, wherein the closure element galvanically connects the CP line and the line providing electrical energy to one another in a state in which said closure element is closing the charging socket.

7. The apparatus of claim 6, wherein the closure element comprises an electrical conductor and/or a microswitch, which responds to a state of the closure element.

8. The apparatus of claim 5, wherein the evaluation unit is designed to output signaling to a user of the electrically drivable vehicle, when the received signal falls below or exceeds a predefined threshold value.

9. An electrically drivable vehicle comprising an apparatus for checking a control pilot (CP) line of a charging socket of the electrically drivable vehicle, the apparatus comprising:

at least part of the CP line;

a line which provides electrical energy and ends in the charging socket; and an evaluation unit, wherein the evaluation unit is designed to check a signal of the line providing electrical energy which is received via the CP line when the charging socket is closed, and wherein when the charging socket is closed it is prevented from contacting charging infrastructure.

* * * * *